(12) United States Patent
Feder et al.

(10) Patent No.: US 6,733,309 B2
(45) Date of Patent: May 11, 2004

(54) DEVICE FOR CONNECTING ELECTRICAL CONDUCTORS

(75) Inventors: Roland Feder, Gurtis (AT); Kurt Ellensohn, Götzis (AT); Jürgen Engbring, Iphofen (DE); Erik Miersch, Wiesenbronn (DE)

(73) Assignee: Hirschmann Austria GmbH, Rankweil (AT)

( * ) Notice: Subject to any disclaimer, the term of this patent is extended or adjusted under 35 U.S.C. 154(b) by 0 days.

(21) Appl. No.: 10/373,770

(22) Filed: Feb. 27, 2003

(65) Prior Publication Data

US 2003/0176095 A1 Sep. 18, 2003

Related U.S. Application Data

(63) Continuation of application No. 09/877,251, filed on Jun. 11, 2001, now abandoned.

(30) Foreign Application Priority Data

Jun. 9, 2000 (DE) .......................................... 100 28 184

(51) Int. Cl.[7] .................................................. H01R 4/58
(52) U.S. Cl. ........................................... 439/86; 439/67
(58) Field of Search ............................... 439/66–67, 77, 439/86, 289, 700

(56) References Cited

U.S. PATENT DOCUMENTS

| | | | | |
|---|---|---|---|---|
| 4,125,310 A | * | 11/1978 | Reardon, II et al. | 439/66 |
| 4,184,729 A | * | 1/1980 | Parks et al. | 439/66 |
| 4,313,129 A | * | 1/1982 | Fukui | 29/832 |
| 4,642,891 A | | 2/1987 | Weik et al. | |
| 4,647,125 A | | 3/1987 | Landi et al. | |
| 4,932,883 A | * | 6/1990 | Hsia et al. | 439/66 |
| 4,934,946 A | | 6/1990 | Ordway | |
| 5,153,396 A | * | 10/1992 | Cummings | 200/83 Q |
| 5,219,303 A | | 6/1993 | Daly et al. | |
| 5,246,384 A | * | 9/1993 | Sato | 439/585 |
| 5,417,577 A | | 5/1995 | Holliday et al. | |
| 5,575,662 A | * | 11/1996 | Yamamoto et al. | 439/67 |
| 5,730,619 A | * | 3/1998 | Hamlin | 439/493 |
| 5,961,344 A | | 10/1999 | Rosales et al. | |

FOREIGN PATENT DOCUMENTS

| | | |
|---|---|---|
| DE | 197 34 872 A1 | 3/1999 |
| DE | 198 32 011 A1 | 2/2000 |
| DE | 198 32 011 * | 2/2000 |
| DE | 199 10 572 A1 | 9/2000 |

* cited by examiner

*Primary Examiner*—Tho D. Ta
*Assistant Examiner*—Larisa Tsukerman
(74) *Attorney, Agent, or Firm*—Fulbright & Jaworski

(57) ABSTRACT

A device for connecting electrical conductors such as flat-band lines, printed circuits or the like, in which pressure media are provided to increase contact reliability, and after mounting thereof, said media ensure that the contact areas of at least two electrical conductors are deformed. The best possible contact area is created by the deformation.

17 Claims, 5 Drawing Sheets

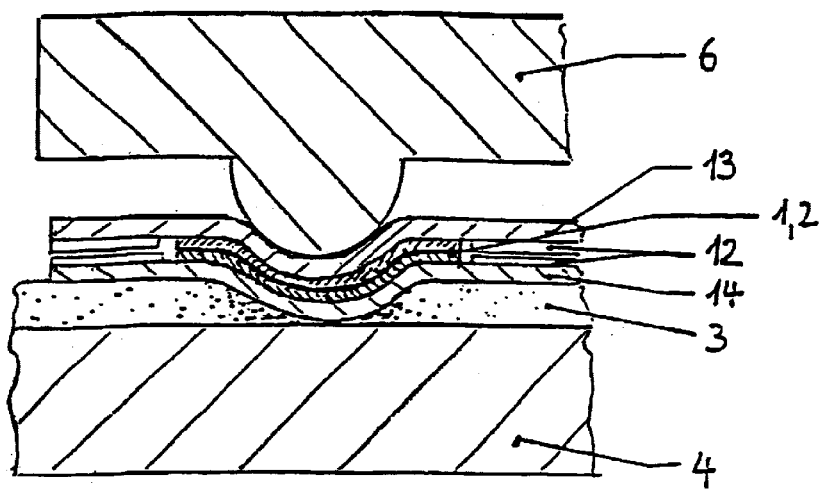
FIG. 4
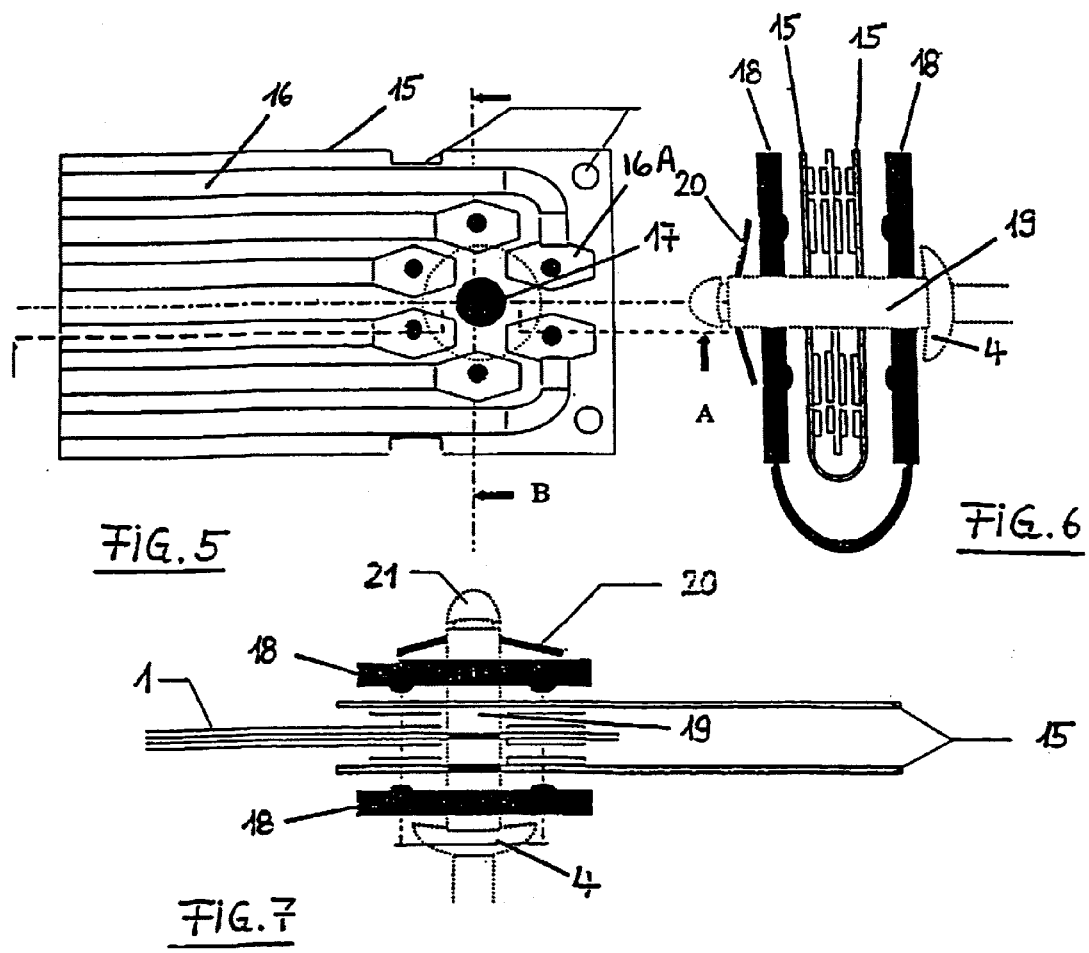
FIG. 5
FIG. 6
FIG. 7

DEVICE FOR CONNECTING ELECTRICAL CONDUCTORS

CROSS REFERENCE TO PRIOR APPLICATION

This is a continuation of application Ser. No. 09/877,251, filed on Jun. 11, 2001, abandoned.

BACKGROUND OF THE INVENTION

1. Field of the Invention

The present invention relates to a device for connecting electrical conductors. More particularly, the present invention relates to a device for connecting electrical conductors such as flat-band lines, printed circuits, conducting foils or the like.

2. Description of the Related Technology

An exemplary prior art device for connecting flat-band lines is described in DE 198 32 011 A1. In this device, the flat-band line has a connecting area that is provided in a detachable connection. An insulating housing, which has spring means for applying the necessary contact forces, is associated with the connecting area. Means are associated with the individual strip conductors of the flat-band line in such a way that the flat-band lines with their contact areas (which are created by stripping insulation) come to lie directly on the associated counter-contact areas of the counterpart to be bonded under the spring action of the spring means. In this configuration, it is essential that at least one contact curvature be pushed out and raised directly from the flat-band line (with a plastically finish-formed contour present for each contact area), whereby after bonding, the back side of the raised contact curvatures that faces away from the counterpart is loaded directly by a spring means. That is, after bonding, the surface of the contact curvature rests, under spring action, on the connecting area of the counterpart. In the device, the counterpart itself is also a flat-band line.

A connection (bonding) of flat-band lines that is created in this way has proven its value per se. One drawback, however, is that the contact is immediately lost if spring action is no longer present. This is a common occurrence, for example as in the device disclosed in DE 198 32 011 A1, it will be appreciated that the spring means are designed as leaf springs which are known to break under harsh environmental conditions.

Another drawback in these types of devices is that the contact curvature comes to lie only tangentially to the connecting area that is involved. As a result, it is practically impossible to produce a high-load electrical connection through which high currents can flow because the contact surface is too small.

In addition, another drawback resides in the fact that before bonding, the contact curvatures must be introduced into the flat-band line by means of an additional operating step. As will be appreciated, a high precision in the positioning of the contact curvatures is necessary. Typically, the contact curvatures must be introduced at precisely the point in the flat-band line in which the spring means can later engage. As will be appreciated, if the spring means is not located exactly in the area in which a contact curvature in the flat-band line is present, inadequate forces or forces outside of the contact area will exist, and accordingly, reliable bonding is not possible.

SUMMARY OF THE INVENTION

One object of the present invention is to avoid the above-mentioned and other drawbacks. Another object of the present invention is to provide a device for connecting electrical conductors which can be produced simply and economically, while also resulting in a device which has reliable bonding.

These and other objects of the present invention may be realized by a device comprising a first electrical conductor having a contact area (which may comprise an area stripped of insulation), a second electrical conductor having a contact area adjacent to the first electrical conductor, and pressure media which exerts force on the contact area of the first electrical conductor sufficient to connect the electrical conductors.

According to one aspect of the invention, the pressure media exert their force on the contact areas of the electrical conductors in such a way that after the connection, the contact areas of the two electrical conductors are deformed.

In accordance with this aspect of the invention, one of the advantages of the present invention lies in the fact that an additional step for the production of contact curvatures can be avoided since the contact curvature is produced only owing to the exertion of pressure of the pressure media on the contact areas that are involved. Thus, any electrical conductors such as flat-band lines, printed circuits or flat-band foils can be used that must not be touched beforehand except for stripping insulation. That is, the contact areas that are involved are deformed in the area in which the pressure media are applied.

In accordance with another aspect of the invention, buffers can be present that are elastic and introduce an additional contact force after the connection, especially over the service life of the connection.

The deformation of the electrical conductors that are involved in the contact area has, moreover, the advantage that the largest possible surface of the contact areas to be bonded comes to rest so that high contact reliability is provided. By the large-area bonding, it is possible at the same time to transmit high currents with comparatively thin or flat electrical lines. Since the pressure media do not necessarily have to be (but can be) absolutely loaded with spring force, the risk of a spring break, from which a contact interruption would result, is also avoided.

Another advantage of the present invention is based on the deformation, wherein according to this aspect, oxide layers break open and thus the bonding is further improved.

In accordance with another aspect of the invention, the pressure media and the contact areas are arranged in a housing, preferably a multipart housing. By the use of a housing, the pressure media, as well as the electrical lines that are involved, can be positionally fixed, whereby the contact areas are also protected from mechanical damage. In addition, the housing can be used to position the entire arrangement at a desired point.

In accordance with another object of the present invention, the contact areas can be closed tightly by using a seal. As a result, ambient or environmental influences (such as, for example, moisture, pollution by electrically conducting particles, etc.) cannot act on the contact areas, so that corrosion, short circuits, etc., can be avoided.

The housing preferably comprises two halves, whereby the inside of the housing is tightly sealed by a seal that is lodged between two housing halves. This seal can be inserted between the housing halves or pre-mounted (for example molded-on) on the outside contours of one housing half. This seal mainly has the purpose of preventing the occurrence of a short circuit between contact areas. As will be appreciated, it is ensured by the seal that each contact area, several contact areas, or all contact areas are protected from outside influences (such as moisture, electrically conducting particles, or the like), so that no short circuits are produced.

The seal can comprise all contact areas, can be arranged around a contact area, or be arranged between two strip conductors.

In accordance with another aspect of the invention, at least a portion of the pressure medium is electrically conductive. As will be appreciated, this has the advantage that the pressure media can assume two different functions. On the one hand, connecting and bonding of the electrical conductors, are produced by deformation, and on the other hand the pressure media can be used for further bonding since they are found in a contact area of electrical conductors. Thus, for example, the pressure media can be designed as a contact sleeve or contact pin. Additional electrical conductors, connectors, electrical components (such as, for example, bridges) or electronic components or even electronic modules can be connected to this sleeve or to the pin.

In accordance with an aspect of the invention, several pressure media that are arranged beside one another are not only designed for bonding deformation, but also are designed as multipolar connectors or as multipolar sleeves, by which a signal or voltage transmission can be carried out.

According to yet another aspect of the invention, the pressure media are loaded with spring force. This has the additional advantage that the large-surface contact areas that lie on top of one another, are deformed and thus adapted or loaded by an additional force after bonding so that the bonding is more reliable. The force can be produced by any suitable means, for example by use of a spring or alternatively by use of an elastic intermediate layer.

In accordance with another aspect of the invention, the electrical conductors lie plane-parallel over one another on a base disposed at least in the contact area, whereby the deformation takes place in the contact area and the support area of the base. As a result, the electrical conductors are placed over one another plane-parallel in a simple way. Then the pressure media are mounted so that the contact areas of at least two electrical conductors are deformed by the mounting of the pressure media. This deformation can be carried out in such a way that the base may or may not be deformed. If the base is not deformed, it must have a material property that withstands the exertion of force of the pressure media. In such a case, it is preferable that the pressure media are also at least partially deformed in the exertion of force. Alternatively, the base can consist of a material that is also deformed with the exertion of force and deformation of the contact areas. If the material of the base does not consist of a deformable material, it is also conceivable to introduce a deformable seating between the base and at least one electrical conductor, whereby said seating is deformed with the exertion of force by the pressure media. Owing to its elasticity, this seating or other suitable medium then preserves the connection over the service life of the device.

In accordance with another aspect of the invention, the electrical conductors lie plane-parallel over one another between at least two pressure media disposed in at least the contact area, whereby the deformation is carried out in the contact areas. In each case, two pressure media are preferereably disposed opposite one another in the contact area, so that the intervening electrical conductors can be deformed. Here, of course, attention must be paid that the exertion of force of the opposite pressure media is not so high that the latter would penetrate the contact areas of the electrical conductors that are involved so that a bonding would be prevented.

BRIEF DESCRIPTION OF THE FIGURES

Various embodiments of the invention, to which the invention is not limited, however, are described below and explained wherein:

FIGS. 3A, 3B 4 show devices for connecting electrical conductors after mounting according to the invention, FIGS. 5, 6 and 7 show another embodiment of a device for connecting electrical conductors according to the invention.

DETAILED DESCRIPTION

Figure 1:
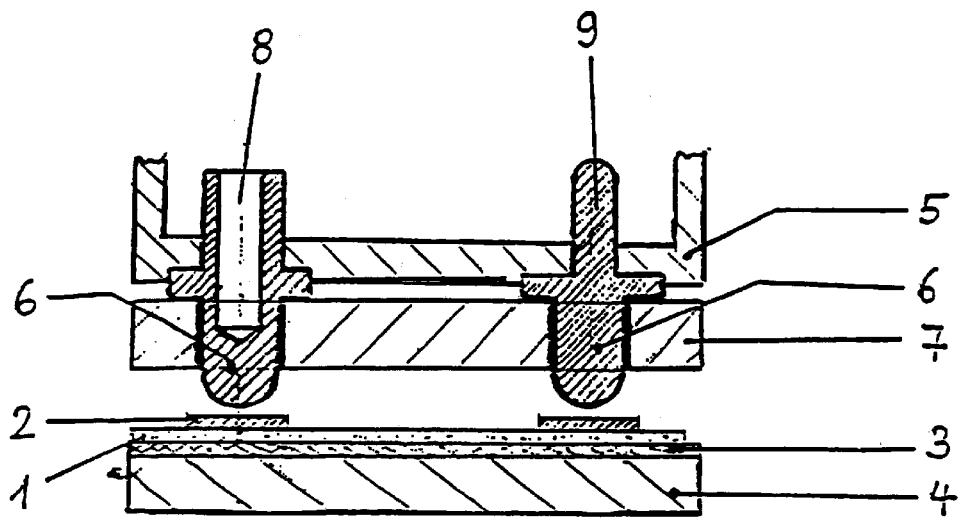
FIGS. 1 and 2 show devices for connecting electrical conductors before mounting according to the invention.

In FIG. 1, a sectional drawing through a hardware example for connecting electrical conductors is shown. As depicted, a first flat-band line 1 and a second flat-band line 2, both of which are stripped of insulation, lie plane-parallel over one another in the contact area. As depicted in FIG. 1, there is a malleable seating 3 under first flat-band line 1, and the seating in turn rests on a non-malleable base 4. A housing 5 is found above base 4, whereby base 4 can be a component of housing 5. Two pressure media 6 are arranged in housing 5, which, when housing 5 moves in the direction of base 4 for the purpose of mounting and then is set, receives two pressure media 6. Two pressure media 6 also penetrate an intermediate layer 7, which is arranged somewhat plane-parallel to base 4.

FIG. 1 also shows that pressure media 6 may have any suitable configuration. As depicted, pressure media may comprise a contact sleeve 8 or a contact pin 9. As will be appreciated by one of ordinary skill in the art, if pressure media 6 are designed as a contact sleeve 8 or contact pin 9, housing 5 or a part thereof is also designed as a connector or sleeve in a complementary way.

As an alternative to the embodiment shown in FIG. 1, the pressure media can also consist of a plane-parallel plate and have curvatures in the area of the contact area of two flat-band lines 1 and 2. This plate (or housing 5 and intermediate layer 7) is moved in the direction of base 4 for the purpose of connecting and bonding and sets after bonding has been completed.

Figure 2:
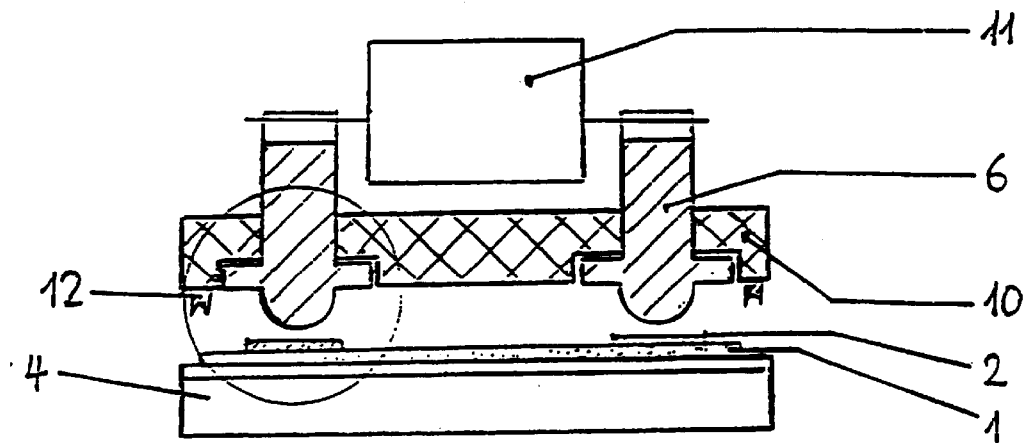

FIG. 2 shows an embodiment similar to FIG. 1 before mounting thereof, whereby here it is shown that reference numeral 10 is a housing upper part that receives pressure media 6, which are designed as contacts. An electronic component 11 is connected between these two contacts (pressure media 6). Instead of an electric component, a bridge or an electronic modulus (i.e., with several electronic components) could also be arranged here.

In addition, it is shown in FIG. 2 that housing upper part 10 has a circumferential seal 12, whereby seal 12 can also be attached to base 4, the component of the housing. As an alternative to this, it is also conceivable that seal 12 be used between base 4 and housing upper part 10. With seal 12, it is achieved that several contact areas of two flat-band lines 1 and 2 are protected from outside influences.

Figure 3A:
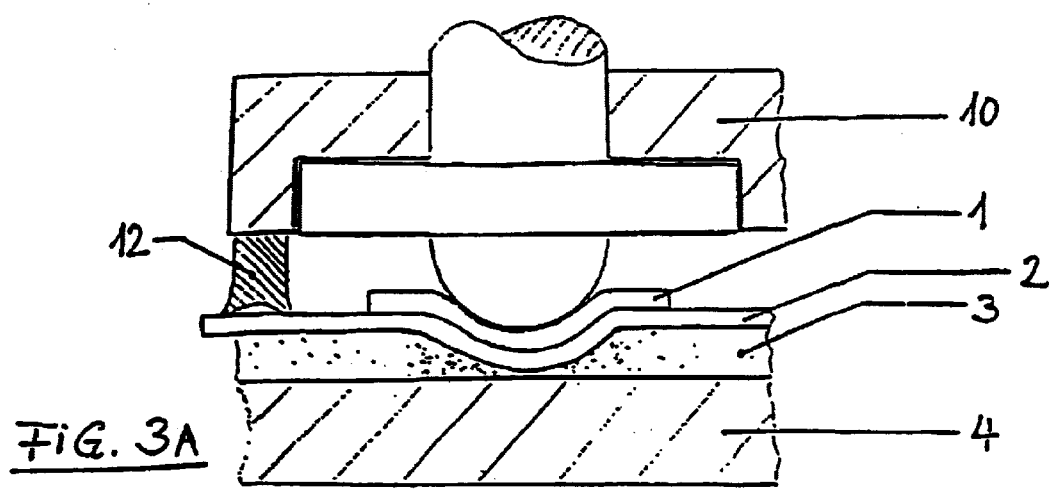
Figure 3B:
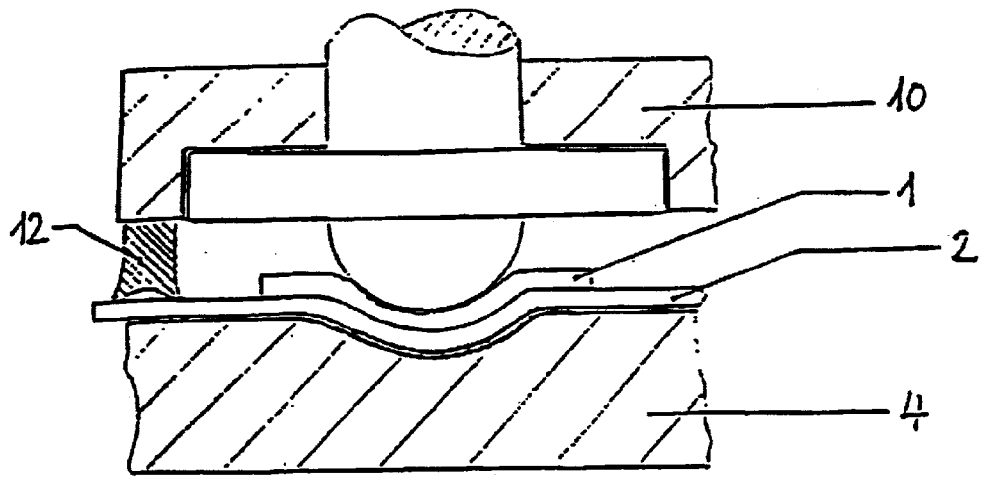

FIG. 3 (FIGS. 3A and 3B) shows connecting electrical conductors according to the invention after their mounting, whereby the device that is depicted in FIG. 2 is reproduced in a cutout, but after its mounting. It can be seen in FIG. 3A that housing upper part 10 with its pressure medium 6 was moved in the direction of base 4, so that the mushroom-shaped end of pressure medium 6 could exert its force on the contact areas of the first and second flat-band lines 1 and 2 and correspondingly deformed the latter. At the same time, seating 3 was also deformed, whereby base 4 comprises a material that withstands the exerted pressure.

As can be seen clearly in FIG. 3, two flat-band lines 1 and 2 in their contact areas preferably rest on as large a surface as possible in order to maximize bonding. After this mounting, housing upper part 10 is rigid relative to base 4 before force is exerted on the contact areas (either deformed seating 3 exerts the force or pressure media 6 are loaded with spring force).

In addition, it can be seen in FIG. 3A that seal 12 does not rest on base 4 in this embodiment. Instead, seal rests on a flat-band line 2. It thus is possible to preserve the sealing action while a flat-band line 2 is simultaneously brought out. This seal 12 can be arranged around the entire device, around contact area groups or around individual contact areas.

FIG. 3B shows an embodiment similar to FIG. 3A, except that there is no malleable seating 3 having elastic properties (as in FIG. 3A). In this embodiment, base 4 is malleable and preferably has elastic properties. In addition, base 4 can have recesses that are slightly smaller than the form of the corresponding pressure media, whereby the contact areas nestle against the recesses.

FIG. 4 shows another device for connecting electrical lines after their mounting, whereby it is shown that pressure media 6 cannot assume any electrical function whatsoever, but rather are designed as plane-parallel plates with mushroom-shaped curvatures. As depicted in FIG. 4, the electrical conductors that are to be connected are printed circuits 13 and 14 between which the contact areas of first and second flat-band lines 1 and 2 are found, whereby the latter can be connected with the contact areas of the printed circuits. Also, here, there is an intervening seal 12, which protects the contact areas from environmental influences, between printed circuits 13 and 14.

In FIGS. 5 to 7, various additional aspects of the invention and alternative embodiments of the device for connecting electrical conductors are depicted.

FIG. 5 shows a printed circuit 15 having several strip conductors 16 arranged thereon. In this embodiment, the end areas 16A of strip conductors 16 are arranged concentrically around a hole 17 disposed in the printed circuit 15. Alternatively, an oval, parallel or linear arrangement of the end areas is conceivable.

In FIG. 6, it is shown that at least two such printed circuits 15, as depicted in FIG. 5, lie plane-parallel over one another. For this purpose, individual strip conductors 16 of the printed circuits 15 are facing one another. Two pressure plates 18 are also arranged in a plane-parallel manner to sandwich the printed circuits. Pressure plates 18 are provided with pressure media (here mushroom-shaped projections) concentrically around hole 17 in a manner which corresponds to the points at which strip conductors 16 end.

Pressure plates 18 also have a non-designated hole in which connecting means 19 can be introduced. For connection, connecting means preferably has a base 4 which comes to lie on a pressure plate 18, and as shown on the left side of FIG. 6, a spring 20 (disk spring) adapted to be superposed and stretched by connecting means 19, which can have, for example, a thread in its interior in which a screw is inserted from the left, which has the effect that the printed circuits 15 and pressure plates 18 are pressed on one another plane-parallel in the direction of base 4.

By this movement and because of the projections in pressure plate 18, a slight deformation of printed circuit 15 or end areas of strip conductors 16 is carried out so that the latter nestle against one another, and maximum bonding is provided.

As is depicted in FIG. 6, still another flat-band line, a two-sided coated printed circuit or an electrical conducting foil can be found between two printed circuits 15, but is not necessarily required.

FIG. 6 shows that two pressure plates 18 are connected to one another via a flexible strap to ensure that the mushroom-shaped projections of pressure plates 18 are always found in the area of the concentrically arranged ends of strip conductors 16 around hole 17 even during or after the mounting. Such a structure can be produced from, for example, plastic as an injection-molding part. The flexible strap can be removed before or after the mounting.

FIG. 7 shows a similar arrangement in which flat-band line 1 is connected with two printed circuits 15. Here again, at least one printed circuit 15 has strip conductors 16, which are arranged according to the embodiment of FIG. 5. Contrary to the embodiment depicted in FIG. 6, two pressure plates 18 are not connected to one another via a strap. The mounting of the device for connecting electrical conductors shown in FIG. 7 is carried out, for example, in the following way:

Mechanical connecting means 19 already has base 4, in which lower pressure plate 18, which also has a hole, is pushed open. Then, printed circuit 15, flat-band line 1 and other printed circuit 15 are pushed open, and upper pressure plate 18 is placed on top of it. Then, spring 20 is also mounted, and the elements that are involved are pressed together by a blind rivet 21 in the direction of base 4. Then, the arrangement that is shown in FIG. 7 can be sealed by a housing by any suitable means. Mechanical connecting means 19 can consist of electrically conducting material or insulating material and optionally be designed for bonding or passing through voltages, passing through signals or for making a mass point.

Spring 20 can also be replaced or supplemented by an elastically deformable intermediate layer between printed circuits 15.

Figure 8:
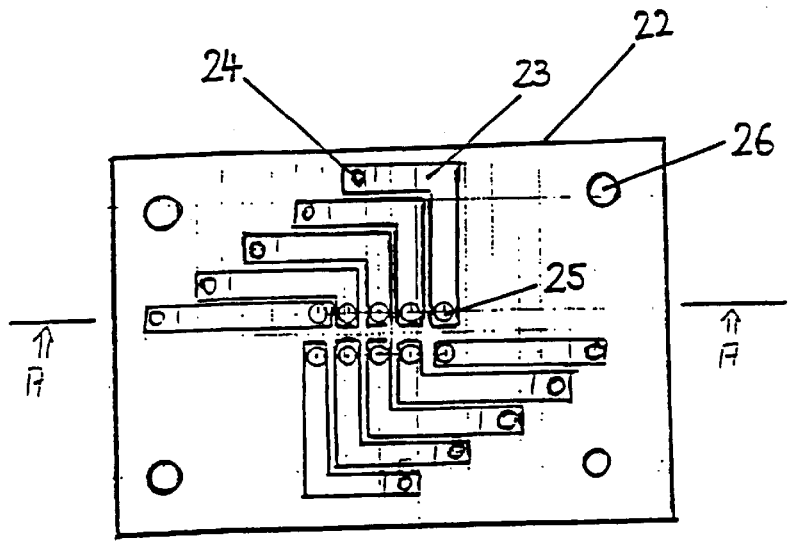
FIGS. 8, 9 and 10 show a device for connecting electrical conductors with a connector.
Figure 9:
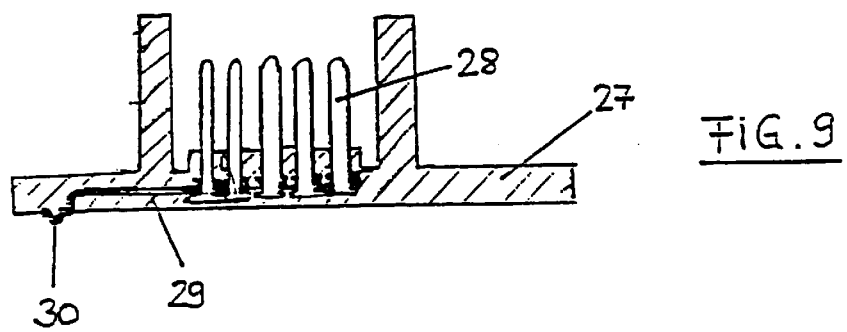
Figure 10:
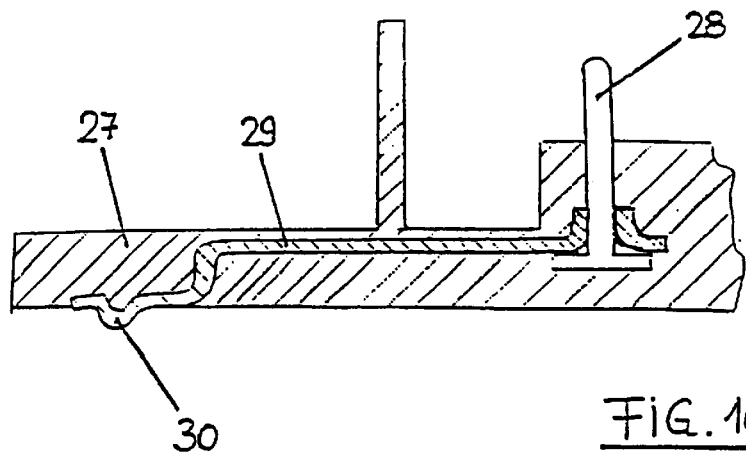

In FIGS. 8 to 10, a device for connecting electrical conductors with a connector is shown. While in the preceding embodiments an essential task was to connect together at least two electrical conductors such as flat-band lines or the like, in the embodiment that is shown in FIGS. 8 to 10, the point is either to bond together at least two flat-band lines and to grip at least one flat-band line via a connector or the like or even to grip bonded flat-band lines via the connector. A connector does not absolutely have to be used. A sleeve, an electric bridge or electronic component (e.g., resistor, coil, condenser) or an electronic system (e.g., microprocessor, modulus) can also be used.

To this end, a printed circuit 22, on which several strip conductors 23 are arranged (here arranged at right angles, in general, however, the arrangement is arbitrary), is shown in FIG. 8. At the ends of each strip conductor 23, a contact point 24 and 25 is present. In the outside areas of printed circuit 22 there are provided holes 26 through which the connecting means can be carried out.

In FIG. 9, a connector 27 is shown, which in terms of its basic dimensions has approximately the same basic dimension as printed circuit 22. Connector 27 has several contact pins 28, whereby inside connector 27, each contact pin 28 is guided outward via conducting tape 29 and ends in a contact tag 30. Each of contact tags 30 that are guided outward corresponds to the position of respective contact point 24 of printed circuit 22. Connector 27, corresponding to the position of holes 26, also has holes to which reference is not made.

Printed circuit 22 and connector 27, as they are shown in FIGS. 8 and 9, can be combined with one another in the following way:

Connector 27 is either mounted plane-parallel on printed circuit 22 and is connected to it by connecting means (such as rivets or the like, which are guided through holes 26), in such a way that contact tags 30, under which connector 27 projects slightly, come to rest under pressure on contact points 24 so that at least one strip conductor 23 is deformed in the area of contact point 24, depending on the arrangement of contact tags 30.

It is also possible, however, that between printed circuit 22 and connector 27, another flat-band line is placed, which is to be connected with at least one contact point 25. For this purpose, the flat-band line that is placed in between (or else several flat-band lines) is stripped of insulation at the points at which the strip conductor in question is to make contact with contact point 25, whereby at the same time, connector 27 has projections in the form of pressure medium 6 on its underside, so that after the assembly of printed circuit 22 and connector 27 including that placed in between, bonding is done by deformation.

In FIG. 10, a type of production of a connector 27 is shown, in which connector 27 consists of plastic, and conducting tapes 29 are designed as plastic-encased pressed screens. In addition, it can be clearly seen in FIG. 10 that here contact tag 30 is designed as a curvature, by which the pressure medium is formed to provide deformation. In the area facing contact tag 30, conducting tape 29 has the contact pin that is pressed into a hole of conducting tape 29, whereby in its end area, conducting tape 29 is run around contact pin 28 into the form shown in FIG. 10, by which contact pin 28 is held securely in its position.

Figure 11:
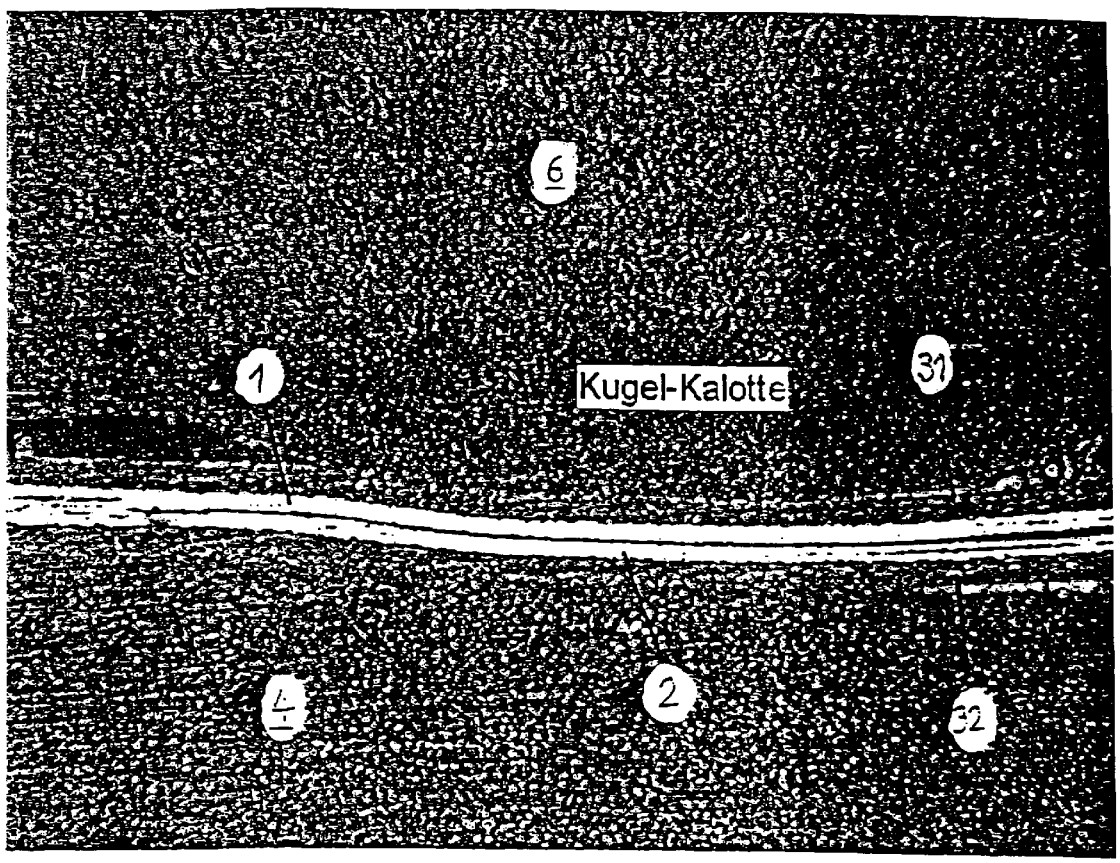
FIG. 11 shows a microscope image in section.

FIG. 11 shows a microscope image of a device for connecting electrical conductors in section. Flat-band lines, i.e., the electrically conducting part of the flat-band line, are referred to with reference numerals 1 and 2. The latter are arranged on a respective carrier 31 and 32, whereby carrier 31 or 32 can be a thin, flexible plastic carrier. It is also conceivable, however, that carrier 31 and 32 is rigid and thus less deformable, or one carrier is flexible and the other carrier is rigid. After the two flat-band lines are laid one on top of the other on base 4, a high, partially acting pressure is produced by applying pressure medium 6 and producing the pressed connection (such as, for example, by the blind rivet) in the area of pressure medium 6, so that both the flat-band line and the carrier (and optionally base 4) malleably deform . In this case, the pressure in the area of pressure medium 6 is so high that an electrically conducting area of flat-band lines 1 and 2 are pressed together in such a way that it is sealed in the contact area of the latter tightly against air, gas, and against other influences. In correspondingly higher exertion of pressure, even a cold fusing of areas to be bonded electrically results, by which reliable connection is produced in every case.

Other connecting measures such as soldering or the like are therefore unnecessary, such that the pressure applied alone is sufficient to ensure permanent electrical contact, whereby additional sealing measures relative to the bonding can be dispensed with. Sealing measures with respect to single, several or all contact areas relative to the short-circuit protection can be performed, however.

What is claimed is:

1. A device for connecting electrical conductors comprising:
   a base;
   a first electrical conductor having a first contact area disposed adjacent said base;
   a second electrical conductor having a second contact area disposed adjacent said first contact area; and
   a pressure medium, said pressure medium disposed to exert force on said first and second contact areas to deform both said first and second contact areas over a deformed area where said first and second contact areas are deformed to be parallel to a portion of said pressure medium in contact with said second contact area, and said first and second contact areas being brought in contact with each other over the deformed area.

2. The device of claim 1, wherein said first and second contact areas comprise areas of said electrical conductors stripped of insulation.

3. The device of claim 2, further comprising a housing in which said pressure medium is disposed.

4. The device of claim 3, wherein said housing, said base and said pressure medium are configured to deform both said first and second contact area.

5. The device of claims 4, further comprising a seal disposed to tightly seal said base to said housing.

6. The device of claim 1, wherein at least a portion of said pressure medium is electronically conductive.

7. The device of claim 6, wherein said pressure medium comprises a contact sleeve or a contact pin.

8. The device of claim 1, wherein said pressure medium comprises a mushroom-shaped curvature disposed to exert force on said first and second contact areas.

9. The device of claim 1, further comprising a spring, said spring disposed to provide force against said pressure medium for deforming and connecting said first and second contact areas.

10. The device of claim 1, wherein said base is deformed when said first and second contact areas are deformed.

11. The device of claim 1, further comprising a deformable seating medium disposed adjacent said first contact area, wherein said deformable seating medium is deformed when said first and second contact areas are deformed.

12. A device for connecting electrical conductors comprising:
   a pair of pressure plates sandwiching a pair of printed circuits facing each other, each of said pressure plates having an opening disposed to be aligned with openings in each of said printed circuits, and each pressure plate having at least one pressure medium disposed adjacent end areas of strip conductors on each of said printed circuits; and
   a connector disposed through said openings in said pair of pressure plates and said printed circuits to force said pressure media to deform said strip conductor end areas adjacent each other to be in contact with each other and to be parallel to a portion of each of said pressure media this is in contact with said printed circuits.

13. The device of claim 12, wherein said connector comprises a body having a base on one end and a forcing element disposed on an opposite end, whereby when said body is disposed through said openings in said pair of pressure plates the base and forcing element cooperate to apply the force to have said pressure media deform said strip conductor end areas.

14. The device of claim 13, wherein said forcing element comprises a disc spring.

15. The device of claim 13, wherein said body comprises electrically conducting material.

16. The device of claim 13, wherein said body comprises insulating material.

17. The device of claim 13, further comprising at least one flat-band line disposed between said facing printed circuits.

* * * * *